United States Patent
Cui et al.

(10) Patent No.: US 12,471,449 B2
(45) Date of Patent: Nov. 11, 2025

(54) ARRAY SUBSTRATE AND MANUFACTURING METHOD THEREOF, AND DISPLAY DEVICE

(71) Applicant: BOE Technology Group Co., Ltd., Beijing (CN)

(72) Inventors: Ying Cui, Beijing (CN); Hongli Wang, Beijing (CN); Danyang Ma, Beijing (CN); Tong Wu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/025,382

(22) PCT Filed: Jun. 29, 2022

(86) PCT No.: PCT/CN2022/102426
§ 371 (c)(1),
(2) Date: Mar. 8, 2023

(87) PCT Pub. No.: WO2024/000290
PCT Pub. Date: Jan. 4, 2024

(65) Prior Publication Data
US 2024/0306427 A1    Sep. 12, 2024

(51) Int. Cl.
*H10K 59/122* (2023.01)
*H10K 59/35* (2023.01)
*H10K 59/80* (2023.01)
*H10K 102/00* (2023.01)

(52) U.S. Cl.
CPC ......... *H10K 59/122* (2023.02); *H10K 59/352* (2023.02); *H10K 59/80515* (2023.02); *H10K 2102/351* (2023.02)

(58) Field of Classification Search
CPC ........... H10K 59/122; H10K 59/80515; H10K 59/352; H10K 2102/351
See application file for complete search history.

(56) References Cited

U.S. PATENT DOCUMENTS 11,997,884 B2 *   5/2024  Zhang ................... H10K 59/122
2016/0284776 A1 *  9/2016  Kim ....................... H10K 59/124

OTHER PUBLICATIONS

Zhang et al., WO 202204918, Oct. 6, 2022 (Year: 2022).*

* cited by examiner

*Primary Examiner* — Mary Ellen Bowman
(74) *Attorney, Agent, or Firm* — IPro, PLLC

(57) ABSTRACT

Provided are an array substrate and a manufacturing method thereof, and a display device. The array substrate includes a pixel defining layer including first sub-pixel opening columns and second sub-pixel opening columns that are alternately arranged; the first sub-pixel opening column includes at least two types of sub-pixel openings having different illumination colors; an area of the sub-pixel opening in the second sub-pixel opening column is greater than that of the sub-pixel opening in the first sub-pixel column; in the first sub-pixel opening column, the pixel defining layer between adjacent sub-pixel openings having the same illumination color is made of a lyophilic material, and the pixel defining layer between adjacent sub-pixel openings having different illumination colors is made of a material that is switched between a lyophilic property and a lyophobic property as an external condition changes.

20 Claims, 6 Drawing Sheets

ARRAY SUBSTRATE AND MANUFACTURING METHOD THEREOF, AND DISPLAY DEVICE

CROSS REFERENCE TO RELATED APPLICATIONS

The present disclosure is a National Stage of International Application No. PCT/CN2022/102426, filed Jun. 29, 2022.

FIELD

The present disclosure relates to the technical field of display, and particularly to an array substrate and a manufacturing method thereof, and a display device.

BACKGROUND

With advantages of low power consumption, self-illumination, a wide viewing angle and a fast response speed, an organic light emitting diode (OLED) display has become a research focus of displays and considered as the next generation display technology.

SUMMARY

Embodiments of the present disclosure provide an array substrate and a manufacturing method thereof, and a display device. The solutions are as follows.

An embodiment of the present disclosure provides an array substrate. The array substrate includes: a substrate and a pixel defining layer on the substrate. The pixel defining layer includes a plurality of first sub-pixel opening columns and a plurality of second sub-pixel opening columns, the plurality of first sub-pixel opening columns and the plurality of second sub-pixel opening columns are alternately arranged in a first direction;

the first sub-pixel opening column includes at least two types of sub-pixel openings with different illumination colors, the second sub-pixel opening column includes sub-pixel openings with a same illumination color, and the illumination color of the sub-pixel opening in the second sub-pixel opening column is different from the illumination colors of the sub-pixel opening in the first sub-pixel opening column; an area of the sub-pixel opening in the second sub-pixel opening column is greater than an area of the sub-pixel opening in the first sub-pixel column;

the pixel defining layer between the first sub-pixel opening column and the second sub-pixel opening column is made of a lyophobic material;

the pixel defining layer between adjacent sub-pixel openings in the second sub-pixel opening column is made of a lyophilic material; and in the first sub-pixel opening column, the pixel defining layer between adjacent sub-pixel openings with the same illumination color is made of a lyophilic material, and the pixel defining layer between adjacent sub-pixel openings with different illumination colors is made of a material that is switched between a lyophilic property and a lyophobic property as an external condition changes.

In some embodiments, in the above array substrate provided in an embodiment of the present disclosure, the pixel defining layer made of the lyophobic material has a first thickness, the pixel defining layer made of the material that is switched between the lyophilic property and the lyophobic property has a second thickness, the pixel defining layer made of the lyophilic material has a third thickness, the first thickness is greater than the second thickness, and the second thickness is greater than the third thickness.

In some embodiments, in the above array substrate provided in an embodiment of the present disclosure, the first thickness ranges from 1 μm to 1.5 μm, the second thickness ranges from 0.6 μm to 1 μm, and the third thickness ranges from 0.3 μm to 0.8 μm.

In some embodiments, in the above array substrate provided in an embodiment of the present disclosure, the first sub-pixel opening column includes a first sub-column and a second sub-column, the first sub-column and the second sub-column are adjacent to each other; the first sub-column and the second sub-column each includes first sub-pixel openings and second sub-pixel openings, the first sub-pixel openings and the second sub-pixel openings are alternately arranged in a second direction; the first sub-pixel openings in the first sub-column and the first sub-pixel openings in the second sub-column are adjacent to each other in a one-to-one correspondence manner; the second direction and the first direction cross with each other; and the second sub-pixel opening column includes two columns of third sub-pixel openings arranged in the first direction.

In some embodiments, in the above array substrate provided in an embodiment of the present disclosure, the first sub-pixel opening is in a shape of a triangle, and two adjacent first sub-pixel openings in the first direction in the first sub-pixel opening column substantially form a rhombus; and the second sub-pixel opening is in a shape of a triangle, the first sub-pixel opening and the second sub-pixel opening that are adjacent to each other in the second direction in the first sub-column substantially form a parallelogram, and the first sub-pixel opening and the second sub-pixel opening that are adjacent to each other in the second direction in the second sub-column substantially form a parallelogram.

In some embodiments, in the above array substrate provided in an embodiment of the present disclosure, the first sub-column and the second sub-column in the first sub-pixel opening column are arranged symmetrical with respect to each other.

In some embodiments, in the above array substrate provided in an embodiment of the present disclosure, the third sub-pixel opening is in a shape of a quadrangle or a rectangle, the third sub-pixel opening and the second sub-pixel opening are adjacent to each other, and side edges, that are adjacent to each other, of the third sub-pixel opening and the second sub-pixel opening are substantially aligned with each other.

In some embodiments, in the above array substrate provided in an embodiment of the present disclosure, a distance between the first sub-pixel opening column and the second sub-pixel opening column is greater than a distance between the first sub-pixel opening and the second sub-pixel opening.

In some embodiments, in the above array substrate provided in an embodiment of the present disclosure, the first sub-pixel openings include red sub-pixel openings, the second sub-pixel openings include green sub-pixel openings, and the third sub-pixel openings include blue sub-pixel openings.

In some embodiments, in the above array substrate provided in an embodiment of the present disclosure, the pixel defining layer between adjacent sub-pixel openings having different illumination colors is made of a material that is switched between a lyophilic property and a lyophobic property as a temperature of the substrate changes.

In some embodiments, in the above array substrate provided in an embodiment of the present disclosure, the material that is switched between the lyophilic property and the lyophobic property of the pixel defining layer includes poly(N-isopropylacrylamide).

In some embodiments, in the above array substrate provided in an embodiment of the present disclosure, an area of the third sub-pixel opening is equal to a total area of the first sub-pixel opening and the second sub-pixel opening.

In some embodiments, the above array substrate provided in an embodiment of the present disclosure further includes: a plurality of anodes arranged between the substrate and the pixel defining layer; and a hole injection layer, a hole transport layer, a light emitting layer and a cathode are sequentially stacked on a side of the pixel defining layer facing away from the substrate;

orthographic projections of the first sub-pixel opening, the second sub-pixel opening and the third sub-pixel opening on the substrate at least cover part of orthographic projections of the anodes on the substrate;

a shape of the anode corresponding to the first sub-pixel opening is same as a shape of the first sub-pixel opening;

a shape of the anode corresponding to the second sub-pixel opening is same as a shape of the second sub-pixel opening; and a shape of the anode corresponding to the third sub-pixel opening is same as a shape of the third sub-pixel opening.

An embodiment of the present disclosure further provides a display device. The display device includes a display panel, and the display panel includes the above array substrate provided in an embodiment of the present disclosure.

An embodiment of the present disclosure further provides a manufacturing method for an array substrate. The method includes:

forming a plurality of anodes on a substrate;

forming, on the substrate on which the anodes are formed, a pixel defining layer including a plurality of first sub-pixel opening columns and a plurality of second sub-pixel opening columns; where the plurality of first sub-pixel opening columns and the plurality of second sub-pixel opening columns are alternately arranged in a first direction; the first sub-pixel opening column includes at least two types of sub-pixel openings with different illumination colors; the second sub-pixel opening column includes sub-pixel openings with a same illumination color; the illumination color of the sub-pixel opening in the second sub-pixel opening column is different from the illumination colors of the sub-pixel opening in the first sub-pixel opening column; an area of the sub-pixel opening in the second sub-pixel opening column is greater than an area of the sub-pixel opening in the first sub-pixel column; the pixel defining layer between the first sub-pixel opening column and the second sub-pixel opening column is made of a lyophobic material; the pixel defining layer between adjacent sub-pixel openings in the second sub-pixel opening column is made of a lyophilic material; and in the first sub-pixel opening column, the pixel defining layer between adjacent sub-pixel openings with the same illumination color is made of a lyophilic material, and the pixel defining layer between adjacent sub-pixel openings with different illumination colors is made of a material that is switched between a lyophilic property and a lyophobic property as an external condition changes;

processing the substrate on which the pixel defining layer are formed under a first external condition, such that the material of the pixel defining layer between the adjacent sub-pixel openings with different illumination colors in the first sub-pixel opening column has a lyophilic property;

sequentially forming a hole injection layer and a hole transport layer that are stacked in red sub-pixel openings, green sub-pixel openings and blue sub-pixel openings through an ink-jet printing process;

processing the substrate on which the hole injection layer and the hole transport layer are formed under a second external condition, such that the material of the pixel defining layer between the adjacent sub-pixel openings with different illumination colors in the first sub-pixel opening column has a lyophobic property; where a temperature of the second external condition is different from that of the first external condition;

forming light emitting layer on a side of the hole transport layer facing away from the substrate through the ink-jet printing process; and forming a cathode on a side of the light emitting layer facing away from the substrate.

DETAILED DESCRIPTION OF THE EMBODIMENTS

Figure 1:
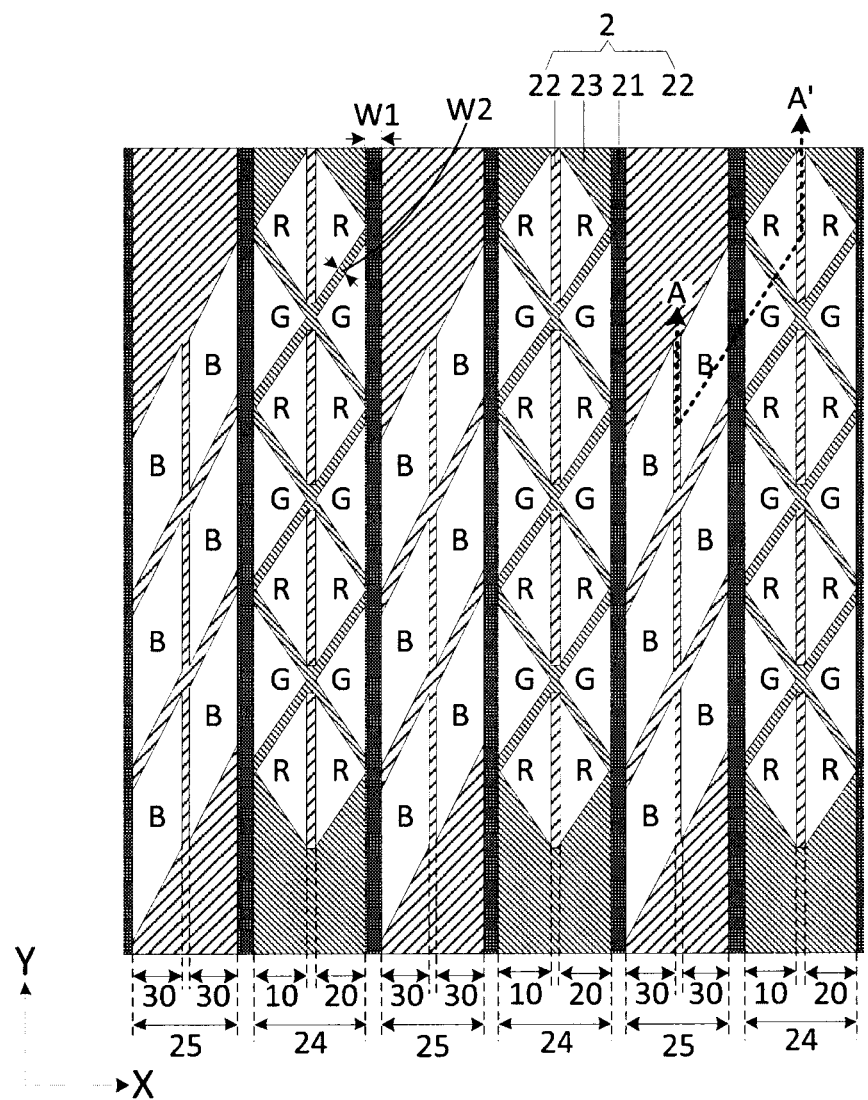
FIG. 1 is a planar schematic structural diagram of an array substrate according to an embodiment of the present disclosure.

In order to make objectives, technical solutions and advantages of embodiments of the present disclosure clearer, the technical solutions of the present disclosure will be clearly and completely described below in combination with accompanying drawings in the embodiments of the present disclosure. Apparently, the described embodiments are merely some embodiments rather than all embodiments of the present disclosure. Embodiments of the present disclosure and features in the embodiments can be combined with each other without conflict. On the basis of the described embodiments of the present disclosure, all other embodiments obtained by those of ordinary skill in the art without making creative efforts fall within the scope of protection of the present disclosure.

Unless otherwise defined, technical terms or scientific terms used in the present disclosure should have the ordinary meanings understood by those of ordinary skill in the art to which the present disclosure belongs. "Include", "contain" or other similar words used in the present disclosure mean that an element or object appearing before the word contains elements or objects listed after the word and equivalents thereof, without excluding other elements or objects. "Connected to", "connected to each other" or other similar words are not limited to physical or mechanical connections, but can include electrical connections, whether direct or indirect. Terms "inner", "outer", "upon", "lower", etc. are merely used to indicate relative position relations, and when the absolute position of a described object changes, the relative position may change accordingly.

It should be noted that sizes and shapes of all patterns in accompanying drawings do not reflect true scale and are merely intended to illustrate contents of the present disclosure. Moreover, from beginning to end, identical or similar reference numerals denote identical or similar elements or elements having identical or similar functions.

The structure of an organic light emitting diode (OLED) mainly includes an anode and a cathode that are oppositely arranged, and a light emitting functional layer located between the anode and the cathode. At present, efficiency and service life of a blue light emitting material are not as desirable as those of a red light emitting material and a green light emitting material, and therefore, an area of a blue sub-pixel is generally designed to be greater than that of a red sub-pixel and a green sub-pixel, so as to make up for deficiencies of the blue light emitting material.

At present, films of the light emitting functional layer of an OLED display are formed mainly through an evaporation method and an ink-jet printing method. The evaporation method for forming films is maturely applied in manufacture of small-size OLED displays, while the ink-jet printing method is considered as an important method for mass production of large-size OLED displays due to a fast film formation rate, a high material utilization rate and a capability to achieve large sizes. Generally, when the films of the light emitting functional layer are manufactured, it is required to manufacture a pixel defining layer on a substrate to define regions in which pixels are located, and then the light emitting functional layer is manufactured in a specific sub-pixel opening region of a corresponding pixel through the ink-jet printing process.

However, in the case of an OLED display manufactured through the ink-jet printing process, printing difficulty of a red sub-pixel and a green sub-pixel that each have a small area will be increased, especially for a high-resolution product, an area of a red sub-pixel and an area of a green sub-pixel are less, and printing difficulty is higher.

Figure 2:
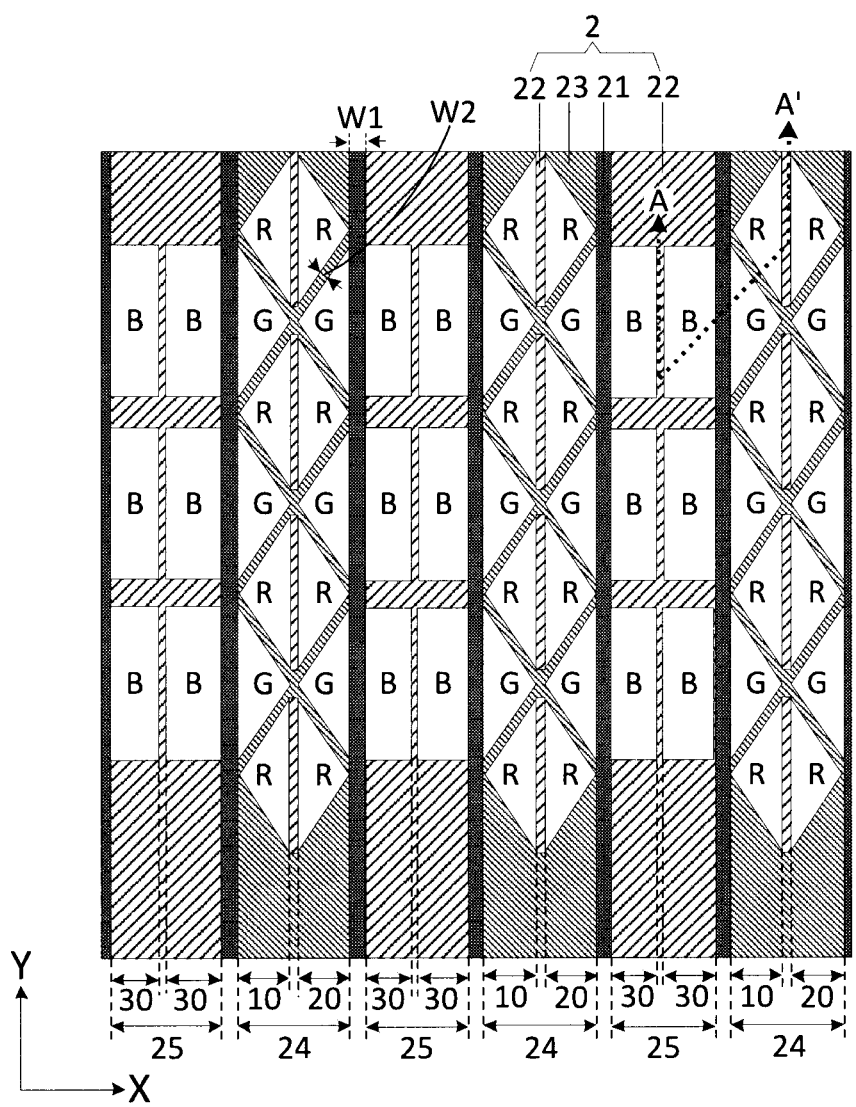
FIG. 2 is a planar schematic structural diagram of another array substrate according to an embodiment of the present disclosure.
Figure 3:
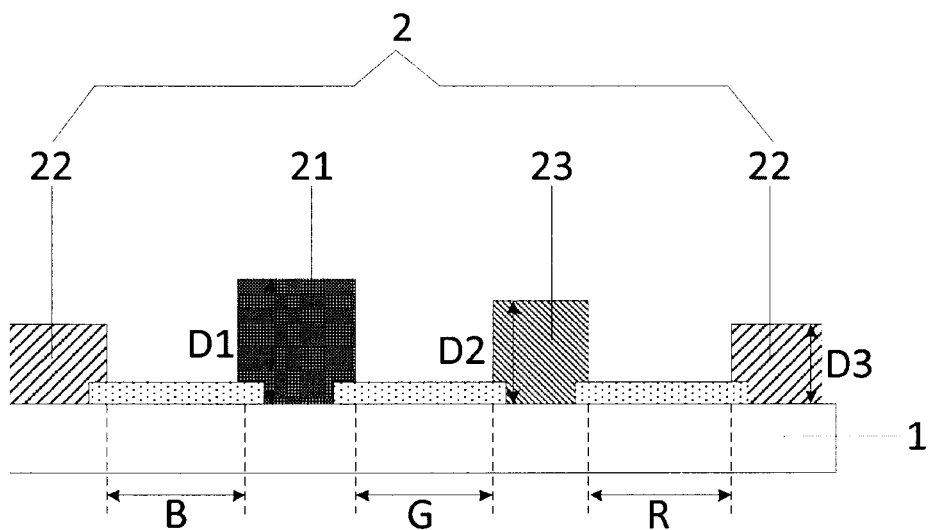
FIG. 3 is a sectional view in direction AA' in FIGS. 1 and 2.

In view of this, an embodiment of the present disclosure provides an array substrate. As shown in FIGS. 1 to 3, top views of two types of array substrates are shown in FIGS. 1 and 2, and a sectional view in direction AA' in FIGS. 1 and 2 is shown in FIG. 3. The array substrate includes: a substrate 1, and a pixel defining layer 2 (including 21, 22 and 23) on the substrate 1. The pixel defining layer 2 include a plurality of first sub-pixel opening columns 24 and second sub-pixel opening columns 25 that are alternately arranged in a first direction X.

The first sub-pixel opening column 24 includes at least two types of sub-pixel openings having different illumination colors (for example, red sub-pixel openings R and green sub-pixel openings G), the second sub-pixel opening column 25 includes sub-pixel openings having the same illumination color (for example, blue sub-pixel openings B), and the illumination color of the sub-pixel opening (B) in the second sub-pixel opening column 25 is different from that of the sub-pixel opening (R, G) in the first sub-pixel opening column 24; an area of the sub-pixel opening (B) in the second sub-pixel opening column 25 is greater than that of the sub-pixel opening (R, G) in the first sub-pixel opening column 24; the pixel defining layer (21) between the first sub-pixel opening column 24 and the second sub-pixel opening column 25 is made of a lyophobic material; the pixel defining layer (22) between adjacent sub-pixel openings (B and B) in the second sub-pixel opening column 25 is made of a lyophilic material; and in the first sub-pixel opening column 24, the pixel defining layer (22) between adjacent sub-pixel openings (for example, R and R) having the same light illumination color is made of a lyophilic material, and the pixel defining layer (23) between adjacent sub-pixel openings (R and G) having different light illumination colors is made of a material that is switched between a lyophilic property and a lyophobic property as an external condition changes.

In the above array substrate provide in an embodiment of the present disclosure, by arranging two types of sub-pixel openings (for example, red sub-pixel openings R and green sub-pixel openings G) in the same first sub-pixel opening column 24, when common layers (for example, a hole injection layer and a hole transport layer) of the red sub-pixel openings R and the green sub-pixel openings G are subsequently manufactured through an ink-jet printing process, the red sub-pixel opening R and the green sub-pixel opening G may be regarded as one large pixel. The pixel defining layer (23) between the red sub-pixel opening R and the green sub-pixel opening G may be set to have a lyophilic property as an external condition changes, such that ink (solutions of all functional film layers) between all the sub-pixel openings in the first sub-pixel opening column 24 is in communication with each other. Therefore, the common layers (for example, the hole injection layer and the hole transport layer) of the red sub-pixel openings R and the green sub-pixel openings G may be simultaneously printed, film formation uniformity of all the sub-pixel openings may be improved, and printing difficulty is greatly reduced. Moreover, since the pixel defining layer (22) between the adjacent sub-pixel openings (for example, R and R) having the same illumination color in the first sub-pixel opening column 24 is made of a lyophilic material, when light emitting layer are printed, two adjacent red sub-pixel openings R may be regarded as one sub-pixel, and a printing area of the red sub-pixel opening R is greatly increased, thereby reducing printing difficulty of a high-resolution array substrate. The pixel defining layer (23) between the red sub-pixel opening R and the green sub-pixel opening G may be set to have a lyophobic property as an external condition changes such that red sub-pixel ink and green sub-pixel ink may be prevented from being mixed. In addition, since the second sub-pixel opening column 25 includes sub-pixel openings having the same illumination color (for example, blue sub-pixel openings B), and the pixel defining layer (22) between every adjacent two blue sub-pixel openings (B and B) in the second sub-pixel opening column 25 is made of a lyophilic material, all the blue sub-pixel openings B in the second sub-pixel opening column 25 may be regarded as one large pixel. Therefore, ink between all the blue sub-pixel openings B in the second sub-pixel opening column 25 is in communication with each other, the hole injection layer, the hole transport layer and the light emitting layer corresponding to the blue sub-pixel openings B in the same column may be simultaneously printed, film formation uniformity of all the blue sub-pixel openings B may be improved, and printing difficulty is greatly reduced. Moreover, since the pixel defining layer 21 between the first sub-pixel opening column 24 and the second sub-pixel opening column 25 is made of a lyophobic material, the blue sub-pixel ink, the red sub-pixel ink and the green sub-pixel ink may be prevented from being mixed.

In some embodiments, as shown in FIG. 3, the pixel defining layer (21) made of the lyophobic material has a first thickness D1, the pixel defining layer (23) made of the material that is switched between the lyophilic property and the lyophobic property has a second thickness D2, the pixel defining layer (22) made of the lyophilic material has a third thickness D3, the first thickness D1 is greater than the second thickness D2, and the second thickness D2 is greater than the third thickness D3. In some embodiments, since the pixel defining layer (22) made of the lyophilic material has the smallest thickness, that is, the pixel defining layer (22) between adjacent red sub-pixel openings R and between adjacent blue sub-pixel openings B have the smallest thickness, when light emitting layer ink corresponding to the red sub-pixel opening R and light emitting layer ink corresponding to the blue sub-pixel opening B are printed, it is guaranteed that the adjacent red sub-pixel openings R may be regarded as one large pixel, and the adjacent blue sub-pixel openings B may be regarded as one large pixel. Therefore, a printing area of a light emitting layer corresponding to the red sub-pixel opening R and a printing area of the light emitting layer corresponding to the blue sub-pixel opening B are greatly increased, thereby further reducing printing difficulty of the high-resolution array substrate. In some embodiments, since the first thickness D1 is the greatest, that is, the pixel defining layer (21) between the first sub-pixel opening column 24 and the second sub-pixel opening column 25 has the greatest thickness (D1), it is further guaranteed that the blue sub-pixel ink, the red sub-pixel ink and the green sub-pixel ink may be prevented from being mixed. In some embodiments, since the second thickness D2 is greater than the third thickness D3, that is, the thickness of the pixel defining layer (23) between the red sub-pixel opening R and the green sub-pixel opening G is greater than that of the pixel defining layer (22) between the adjacent red sub-pixel openings R, it is further guaranteed that the red sub-pixel ink and the green sub-pixel ink may be prevented from being mixed.

In some embodiments, in the above array substrate provided in an embodiment of the present disclosure, as shown in FIG. 3, the first thickness D1 may range from 1 μm to 1.5 μm, the second thickness D2 may range from 0.6 μm to 1 μm, the third thickness D3 may range from 0.3 μm to 0.8 μm, and it is required to guarantee that the first thickness D1 is greater than the second thickness D2, and the second thickness D2 is greater than the third thickness D3.

In some embodiments, as shown in FIGS. 1 and 2, the first sub-pixel opening column 24 may include a first sub-column 10 and a second sub-column 20 that are adjacent to each other, the first sub-column 10 and the second sub-column 20 may each include first sub-pixel openings (for example, red sub-pixel openings R) and second sub-pixel openings (for example, green sub-pixel openings G) that are alternately arranged in a second direction Y, and the first sub-pixel openings (R) in the first sub-column 10 and the first sub-pixel openings (R) in the second sub-column 20 are adjacent to each other in a one-to-one correspondence manner; the second direction Y and the first direction X cross; and the second sub-pixel opening column 25 includes two columns of third sub-pixel openings 30 (for example, blue sub-pixel openings B) arranged in the first direction X. According to a method for designing sub-pixel openings in an embodiment of the present disclosure, printing difficulty of manufacturing a light emitting functional layer through an ink-jet printing process may be reduced.

In some embodiments, as shown in FIGS. 1 and 2, the first sub-pixel opening (for example, the red sub-pixel opening R) may be in a shape of a triangle, and two adjacent first sub-pixel openings (R and R) in the first direction X in the first sub-pixel opening column 24 substantially form a rhombus.

The second sub-pixel opening (for example, the green sub-pixel opening G) may be in a shape of a triangle, the first sub-pixel opening (R) and the second sub-pixel opening (G) that are adjacent to each other in the second direction Y in the first sub-column 10 substantially form a parallelogram, and the first sub-pixel opening (R) and the second sub-pixel opening (G) that are adjacent to each other in the second direction Y in the second sub-column 20 substantially form a parallelogram. According to a method for designing the first sub-pixel opening (R) and the second sub-pixel opening (G), the first sub-pixel opening (R) and the second sub-pixel opening (G) may be manufactured by means of an area of the array substrate to the maximum extent, which is conducive to realization of high resolution.

In some embodiments, in the above array substrate provided in an embodiment of the present disclosure, as shown in FIGS. 1 and 2, the first sub-column 10 and the second sub-column 20 in the first sub-pixel opening column 24 may be arranged symmetrical with respect to each other. In some embodiments, since before the pixel defining layer 2 is manufactured, it is required to manufacture patterned anodes 3, and the sub-pixel opening is consistent with a pattern of the anode 3, by arranging the first sub-column 10 and the second sub-column 20 symmetrical with respect to each other, processes for manufacturing the anodes 3 may be unified, and process complexity may be reduced.

In some embodiments, the third sub-pixel opening (B) may be in a shape of a quadrangle or a rectangle. In some embodiments, as shown in FIG. 1, the third sub-pixel opening (B) is in a shape of a quadrangle, for example, a parallelogram. As shown in FIG. 2, the third sub-pixel opening (B) is in a shape of a rectangle. As shown in FIGS. 1 and 2, the third sub-pixel opening (B) and the second sub-pixel opening (G) are adjacent to each other, and side edges, that are adjacent to each other, of the third sub-pixel opening (B) and the second sub-pixel opening (G) are substantially aligned with each other. In this way, the red sub-pixel opening R, the green sub-pixel opening G and the blue sub-pixel opening B form one display pixel (one repetitive unit) to realize color display.

It should be noted that in an embodiment of the present disclosure, first sub-pixel openings including red sub-pixel openings, second sub-pixel openings including green sub-pixel openings, and third sub-pixel openings including blue sub-pixel openings are taken as an example. Certainly, sub-pixel openings are not limited thereto, and may include sub-pixel openings of other colors, for example, white sub-pixel openings.

In some embodiments, as shown in FIGS. 1 and 2, a distance W1 between the first sub-pixel opening column 24 and the second sub-pixel opening column 25 is greater than a distance W2 between the first sub-pixel opening (R) and the second sub-pixel opening (G). In this way, when printed, the blue sub-pixel ink may be limited in the second sub-pixel opening column 25, such that it is further guaranteed that the blue sub-pixel ink may not be mixed with the green sub-pixel ink and the red sub-pixel ink.

In some embodiments, as shown in FIGS. 1 to 3, the material of the pixel defining layer (23) between the adjacent sub-pixel openings (R and G) having different illumination colors is switched between the lyophilic property and the lyophobic property as a temperature of the substrate 1 changes. In some embodiments, the lyophilic property and the lyophobic property of the pixel defining layer (23) between R and G may be adjusted by adjusting a temperature of the substrate 1. For example, when common layers (the hole injection layer and the hole transport layer) of red sub-pixel openings R and green sub-pixel openings G are printed, the substrate 1 may be heated to a temperature less than a certain temperature such that the pixel defining layer (23) between R and G has the lyophilic property. In this way, when the common layers are printed, the red sub-pixel opening R and the green sub-pixel opening G may be regarded as one large pixel, ink (solutions of all functional film layers) between all sub-pixel openings in the first sub-pixel opening column 24 is in communication with each other, the common layers (for example, the hole injection layer and the hole transport layer) of the red sub-pixel openings R and the green sub-pixel openings G may be simultaneously printed, film formation uniformity of all the sub-pixel openings may be improved, and printing difficulty may be greatly reduced. Before the light emitting layer is printed, the substrate 1 may be heated to a temperature greater than a certain temperature, such that the pixel defining layer (23) between R and G has the lyophobic property. In this way, when the light emitting layer are printed, ink of the light emitting layer in the green sub-pixel opening and ink of the light emitting layer in the red sub-pixel opening may be prevented from being mixed.

In some embodiments, the lyophilic property refers to a property of having an affinity for a solution. The lyophobic property refers to a property of having an ability to repel a solution. The pixel defining layer (23) having a lyophilic property means that a contact angle between the pixel defining layer (23) and a solution is generally less than a certain angle. The pixel defining layer (23) having a lyophobic property means that a contact angle between the pixel defining layer (23) and a solution is generally greater than a certain angle.

In some embodiments, the lyophilic material of the pixel defining layer (22) may be polyimide or polymethyl methacrylate, and the lyophobic material of the pixel defining layer (21) may be fluorine-containing polymethyl methacrylate or fluorine-containing polyimide, which is certainly not limited thereto.

In some embodiments, as shown in FIGS. 1-3, the material that may be switched between a lyophilic property and a lyophobic property of the pixel defining layer (23) may include, but is not limited to, poly(N-isopropylacrylamide) (PNIPAM for short). In some embodiments, the lyophilic property and the lyophobic property of the PNIPAM are extremely sensitive to temperature, such that the lyophilic property and the lyophobic property of the pixel defining layer (23) between R and G may be adjusted according to temperature. For example, in the case that the temperature of the substrate 1 is less than 32° C., the pixel defining layer (23) has a lyophilic property, and the contact angle between the pixel defining layer (23) and water is generally 5 degrees-10 degrees. In the case that the temperature of the substrate 1 is greater than 32° C., the pixel defining layer (23) has a lyophobic property, and the contact angle between the pixel defining layer (23) and water is generally 40 degrees-70 degrees, which may satisfy requirements of printing ink such that red ink and green ink may not be mixed.

It should be noted that in an embodiment of the present disclosure, the material that is switched between a lyophilic property and a lyophobic property of the pixel defining layer (23) being poly(N-isopropylacrylamide) is taken as an example, certainly, when other materials that may be switched between a lyophilic property and a lyophobic property are used, a temperature of the substrate 1 may change, and the contact angle between the pixel defining layer 23 having a lyophilic property and water, and the contact angle between the pixel defining layer 23 having a lyophobic property and water may change, which depends on actual materials of the pixel defining layer 23.

It should be noted that in an embodiment of the present disclosure, the material of the pixel defining layer (23) being switched between a lyophilic property and a lyophobic property as a temperature of the substrate 1 changes is taken as an example, which is certainly not limited thereto. For example, the material that may be switched between a lyophilic property and a lyophobic property under ultraviolet light may be used, and all materials that may be switched between a lyophilic property and a lyophobic property as an external condition changes fall within the scope of protection of an embodiment of the present disclosure.

In some embodiments, due to properties of a blue light emitting material, efficiency and service life of the blue light emitting material are not as desirable as those of a red light emitting material and a green light emitting material. Therefore, in the above array substrate provided in an embodiment of the present disclosure, as shown in FIGS. 1 and 2, an area of the blue sub-pixel opening B is designed to be greater than an area of the red sub-pixel opening R, and the area of the blue sub-pixel opening B is designed to be greater than an area of the green sub-pixel opening G, so as to make up for deficiencies of the blue light emitting material, which is conducive to balance of brightness of sub-pixels having different colors, and prolonging of service life of a display device. In some embodiments, an area of the third sub-pixel opening (blue sub-pixel opening B) is equal to a total area of the first sub-pixel opening (red sub-pixel opening R) and the second sub-pixel opening (green sub-pixel opening G).

Figure 4:
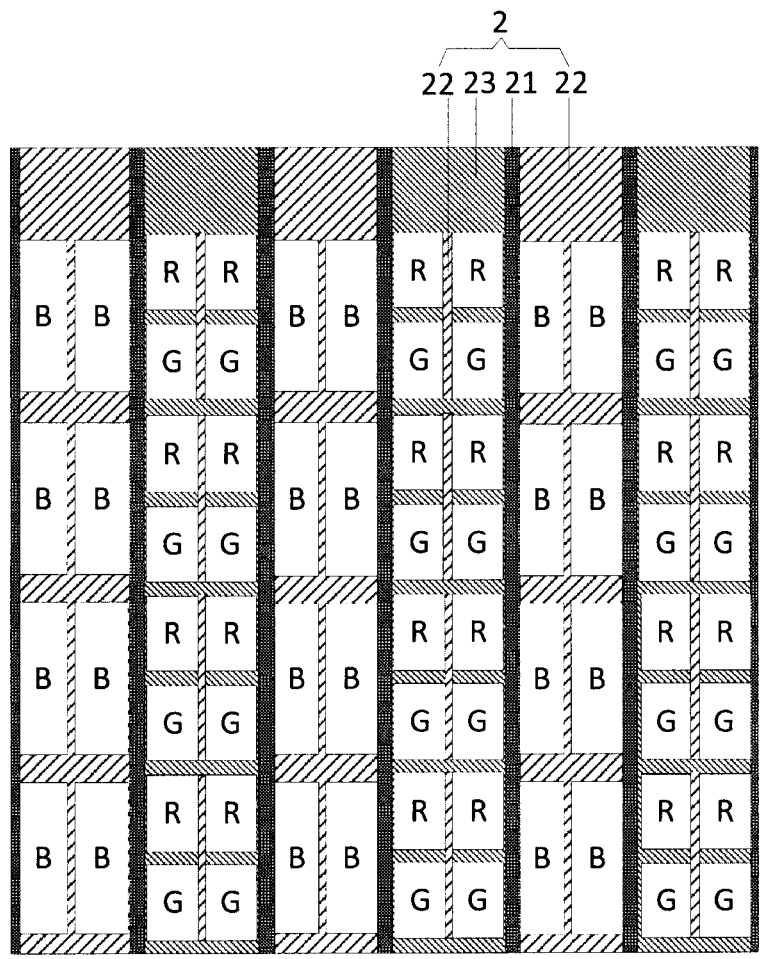
FIG. 4 is a planar schematic structural diagram of yet another array substrate according to an embodiment of the present disclosure.

It should be noted that in an embodiment of the present disclosure, the red sub-pixel opening R being in a shape of a triangle, the green sub-pixel opening G being in a shape of a triangle, and the blue sub-pixel openings B being in a shape of a quadrangle are taken as an example in FIG. 1, the red sub-pixel opening R being in a shape of a triangle, the green sub-pixel opening G being in a shape of a triangle, and the blue sub-pixel openings B being in a shape of a rectangle are taken as an example in FIG. 2, certainly, In some embodiments, each of the red sub-pixel opening R, the green sub-pixel opening G and the blue sub-pixel opening B may be in a shape of a rectangle, which is certainly not limited thereto as shown in FIG. 4.

In some embodiments, in the case that the structure shown in FIG. 4 is used, the pixel defining layer 22 between the green sub-pixel opening G and the green sub-pixel opening G is made of a lyophilic material.

Figure 5:
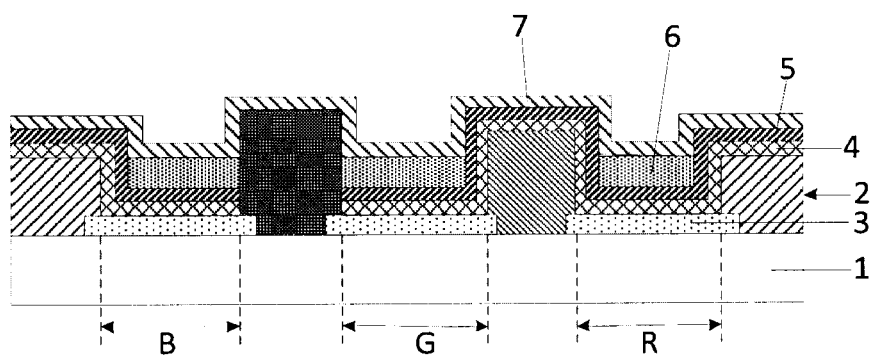
FIG. 5 is a sectional view of another array substrate according to an embodiment of the present disclosure.

In some embodiments, as shown in FIG. 5, the array substrate further includes: a plurality of anodes 3 arranged between the substrate 1 and the pixel defining layer 2, and the hole injection layer 4, the hole transport layer 5, the light emitting layer 6 and the cathode 7 that are sequentially stacked on a side of the pixel defining layer 2 facing away from the substrate 1.

Orthographic projections of the first sub-pixel opening (R), the second sub-pixel opening (G) and the third sub-pixel opening (B) on the substrate 1 at least cover orthographic projections of corresponding ones of the anodes 3 on the substrate 1, a shape of the anode 3 corresponding to the first sub-pixel opening (R) is the same as that of the first sub-pixel opening (R), a shape of the anode 3 corresponding to the second sub-pixel opening (G) is the same as that of the second sub-pixel opening (G), and a shape of the anode 3 corresponding to the third sub-pixel opening (B) is the same as that of the third sub-pixel opening (B).

Figure 6:
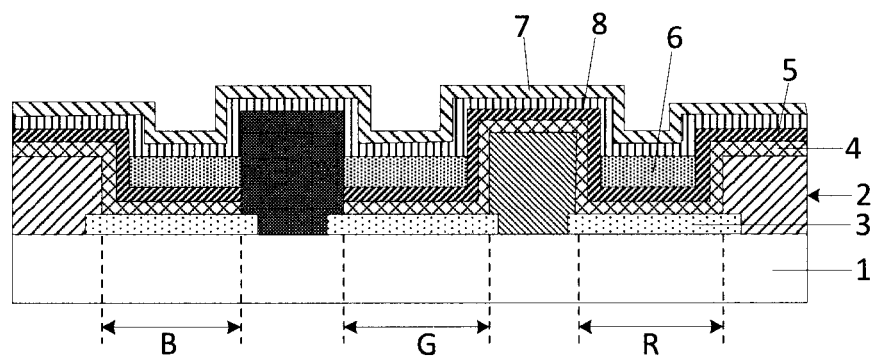
FIG. 6 is a sectional view of yet another array substrate according to an embodiment of the present disclosure.
Figure 7:
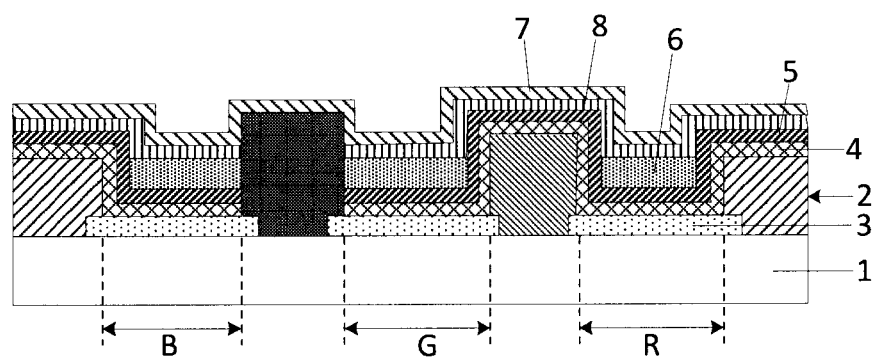
FIG. 7 is a sectional view of still another array substrate according to an embodiment of the present disclosure.

In some embodiments, in order to improve carrier balance, as shown in FIG. 6, the above array substrate provided in an embodiment of the present disclosure may further include electron transport layers 8 located between the cathode 7 and the light emitting layer 6. In some embodiments, the electron transport layer 8 may be formed through an evaporation method or an ink-jet printing method. When manufactured through the evaporation method, the electron transport layer 8 is of a structure of an entire surface, which is as shown in FIG. 6. When manufactured through the ink-jet printing method, the electron transport layer 8 may be manufactured through the same printing method as the hole injection layer 4 and the hole transport layer 5, that is, the electron transport layers 8 corresponding to the red sub-pixel opening R and the green sub-pixel opening G may be simultaneously printed, and the electron transport layer 8 corresponding to the blue sub-pixel opening B may be separately printed, and formed structures are the same as the structure of the hole injection layer 4 and the structure of the hole transport layer 5, which is as shown in FIG. 7.

In some embodiments, in the above array substrate provided in an embodiment of the present disclosure, as shown in FIG. 6, the hole injection layer 4, the hole transport layer 5, the light emitting layer 6, the electron transport layer 8 and the cathode 7 that are sequentially stacked form a light emitting functional layer. The display device is generally divided into an upright structure and an inverted structure. In the case that the display device in which the array substrate provided in an embodiment of the present disclosure is located is of an upright structure, anodes 3, the hole injection layer 4, the hole transport layer 5, the light emitting layer 6, the electron transport layer 8 and the cathode 7 are sequentially formed on the substrate 1, which are as shown in FIGS. 6 and 7. In the case that the display device in which the array substrate provided in an embodiment of the present disclosure is located is of an inverted structure, the cathode 7, the electron transport layer 8, the light emitting layer 6, the hole transport layer 5, the hole injection layer 4 and anodes 3 are sequentially formed on the substrate 1. Certainly, the light emitting functional layer may further include an electron injection layer arranged between the cathode 7 and the electron transport layer 8. In an embodiment of the present disclosure, the light emitting functional layer 4 including the hole injection layer 4, the hole transport layer 5, the light emitting layer 6 and the electron transport layer 8 is taken as an example for description.

In some embodiments, the above array substrate provided in an embodiment of the present disclosure may further include other functional structures well known to those skilled in the art, for example, an active layer, a gate, a source, a drain, and an encapsulation layer located on one side of a cathode layer facing away from a substrate, which will not be described in detail herein.

Figure 8:
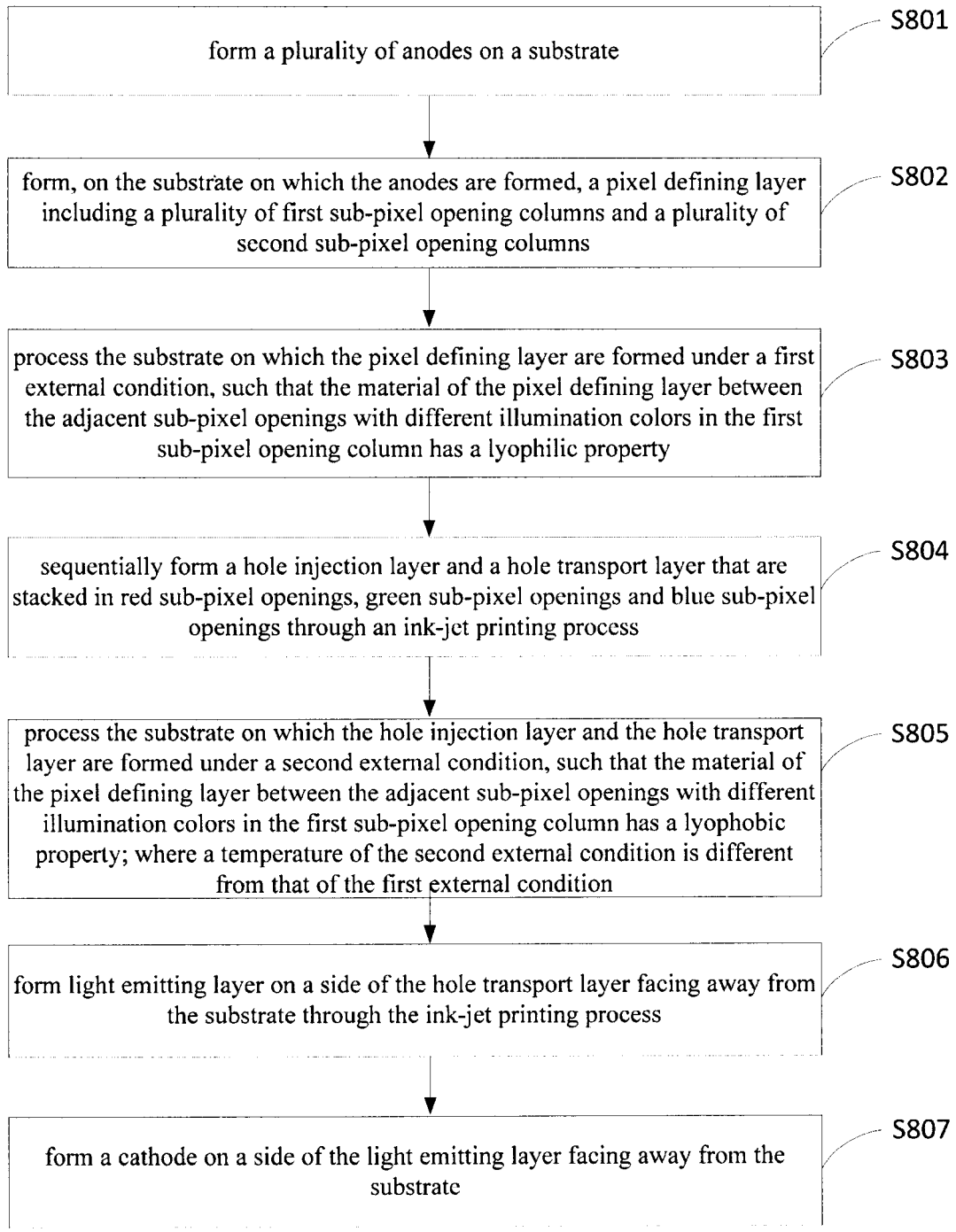
FIG. 8 is a schematic flow diagram of a manufacturing method for an array substrate according to an embodiment of the present disclosure.

On the basis of the same inventive concept, an embodiment of the present disclosure further provides a manufacturing method for an array substrate. As shown in FIG. 8, the manufacturing method includes:

step S801: form a plurality of anodes on a substrate;

step S802: form, on the substrate on which the anodes are formed, a pixel defining layer including a plurality of first sub-pixel opening columns and a plurality of second sub-pixel opening columns; where the plurality of first sub-pixel opening columns and the plurality of second sub-pixel opening columns are alternately arranged in a first direction; the first sub-pixel opening column includes at least two types of sub-pixel openings with different illumination colors; the second sub-pixel opening column includes sub-pixel openings with a same illumination color; the illumination color of the sub-pixel opening in the second sub-pixel opening column is different from the illumination colors of the sub-pixel opening in the first sub-pixel opening column; an area of the sub-pixel opening in the second sub-pixel opening column is greater than an area of the sub-pixel opening in the first sub-pixel column; the pixel defining layer between the first sub-pixel opening column and the second sub-pixel opening column is made of a lyophobic material; the pixel defining layer between adjacent sub-pixel openings in the second sub-pixel opening column is made of a lyophilic material; and in the first sub-pixel opening column, the pixel defining layer between adjacent sub-pixel openings with the same illumination color is made of a lyophilic material, and the pixel defining layer between adjacent sub-pixel openings with different illumination colors is made of a material that is switched between a lyophilic property and a lyophobic property as an external condition changes;

step S803: process the substrate on which the pixel defining layer are formed under a first external condition, such that the material of the pixel defining layer between the adjacent sub-pixel openings with different illumination colors in the first sub-pixel opening column has a lyophilic property;

step S804: sequentially form a hole injection layer and a hole transport layer that are stacked in red sub-pixel openings, green sub-pixel openings and blue sub-pixel openings through an ink-jet printing process;

step S805: process the substrate on which the hole injection layer and the hole transport layer are formed under a second external condition, such that the material of the pixel defining layer between the adjacent sub-pixel openings with different illumination colors in the first sub-pixel opening column has a lyophobic property; where a temperature of the second external condition is different from that of the first external condition;

step S806: form light emitting layer on a side of the hole transport layer facing away from the substrate through the ink-jet printing process; and step S807: form a cathode on a side of the light emitting layer facing away from the substrate.

It should be noted that for manufacturing methods for the hole injection layer, the hole transport layer and the light emitting layer in the above manufacturing methods provided in an embodiment of the present disclosure, reference may be made to the relevant manufacturing description of these film layers in the above array substrate.

In some embodiments, after the light emitting layer is manufactured and before the cathode is formed, the electron transport layer, the electron injection layer, etc. may be manufactured.

On the basis of the same inventive concept, an embodiment of the present disclosure further provides a display device. The display device includes a display panel, and the display panel includes the above array substrate provided in an embodiment of the present disclosure. Since the principle of solving problems of the display device is similar to that of the above array substrate, for implementation of the display device, reference may be made to implementation of the above array substrate, and repetitions will not be described. The display device may be a mobile phone, a tablet computer, a television, a monitor, a notebook computer, a digital photo frame, a navigator or other products or components having a display or touch control function.

The above display device provided in an embodiment of the present disclosure may further include other functional structures well known to those skilled in the art, which will not be described in detail herein.

Embodiments of the present disclosure provide an array substrate and a manufacturing method thereof, and a display device. In the above array substrate provide in an embodiment of the present disclosure, by arranging two types of sub-pixel openings (for example, red sub-pixel openings and green sub-pixel openings) in the same first sub-pixel opening column, when common layers (for example, the hole injection layer and the hole transport layer) of the red sub-pixel openings and the green sub-pixel openings are subsequently manufactured through an ink-jet printing process, the red sub-pixel opening and the green sub-pixel opening may be regarded as one large pixel. The pixel defining layer between the red sub-pixel opening and the green sub-pixel opening may be set to have a lyophilic property as an external condition changes, such that ink (solutions of all functional film layers) between all the sub-pixel openings in the first sub-pixel opening column is in communication with each other. Therefore, the common layers (for example, the hole injection layer and the hole transport layer) of the red sub-pixel openings and the green sub-pixel openings may be simultaneously printed, film formation uniformity of all the sub-pixel openings may be improved, and printing difficulty is greatly reduced. Moreover, since the pixel defining layer between the adjacent sub-pixel openings having the same illumination color in the first sub-pixel opening column is made of a lyophilic material, when the light emitting layer are printed, two adjacent red sub-pixel openings may be regarded as one sub-pixel, and a printing area of the red sub-pixel opening is greatly increased, thereby reducing printing difficulty of a high-resolution array substrate. The pixel defining layer between the red sub-pixel opening and the green sub-pixel opening may be set to have a lyophobic property as an external condition changes such that red sub-pixel ink and green sub-pixel ink may be prevented from being mixed. In addition, since the second sub-pixel opening column includes sub-pixel openings (for example, blue sub-pixel openings) having the same illumination color, and the pixel defining layer between two adjacent blue sub-pixel openings in the second sub-pixel opening column is made of a lyophilic material, all the blue sub-pixel openings in the second sub-pixel opening column may be regarded as one large pixel. Therefore, ink between all the blue sub-pixel openings in the second sub-pixel opening column is in communication with each other, the hole injection layer, the hole transport layer and the light emitting layer corresponding to the blue sub-pixel openings in the same column may be simultaneously printed, film formation uniformity of all the blue sub-pixel openings may be improved, and printing difficulty is greatly reduced. Moreover, since the pixel defining layer between the first sub-pixel opening column and the second sub-pixel opening column is made of a lyophobic material, the blue sub-pixel ink may be prevented from being mixed with the red sub-pixel ink and the green sub-pixel ink.

Although preferred embodiments of the present disclosure have been described, those skilled in the art can still make additional changes and modifications to these embodiments once they learn the basic inventive concept. Therefore, the appended claims are intended to be interpreted as including preferred embodiments and all changes and modifications falling within the scope of the present disclosure.

Apparently, those skilled in the art can make various modifications and variations to embodiments of the present disclosure without departing from the spirit and scope of the present disclosure. In this way, if these modifications and variations of embodiments of the present disclosure fall within the scope of the claims of the present disclosure and equivalent technologies thereof, the present disclosure is further intended to include these modifications and variations.

What is claimed is:

1. An array substrate, comprising: a substrate and a pixel defining layer on the substrate; wherein:
   the pixel defining layer comprises a plurality of first sub-pixel opening columns and a plurality of second sub-pixel opening columns, the plurality of first sub-pixel opening columns and the plurality of second sub-pixel opening columns are alternately arranged in a first direction;
   the first sub-pixel opening column comprises at least two types of sub-pixel openings with different illumination colors;
   the second sub-pixel opening column comprises sub-pixel openings with a same illumination color;
   the illumination color of the sub-pixel opening in the second sub-pixel opening column is different from the illumination colors of the sub-pixel opening in the first sub-pixel opening column;
   an area of the sub-pixel opening in the second sub-pixel opening column is greater than an area of the sub-pixel opening in the first sub-pixel column;
   the pixel defining layer between the first sub-pixel opening column and the second sub-pixel opening column is made of a lyophobic material;
   the pixel defining layer between adjacent sub-pixel openings in the second sub-pixel opening column is made of a lyophilic material; and
   in the first sub-pixel opening column, the pixel defining layer between adjacent sub-pixel openings with the same illumination color is made of a lyophilic material, and the pixel defining layer between adjacent sub-pixel openings with different illumination colors is made of a material that is switched between a lyophilic property and a lyophobic property as an external condition changes.

2. The array substrate according to claim 1, wherein the pixel defining layer made of the lyophobic material has a first thickness;
   the pixel defining layer made of the material that is switched between the lyophilic property and the lyophobic property has a second thickness; and
   the pixel defining layer made of the lyophilic material has a third thickness;
   wherein the first thickness is greater than the second thickness, and the second thickness is greater than the third thickness.

3. The array substrate according to claim 2, wherein the first thickness ranges from 1 μm to 1.5 μm, the second thickness ranges from 0.6 μm to 1 μm, and the third thickness ranges from 0.3 μm to 0.8 μm.

4. The array substrate according to claim 1, wherein the first sub-pixel opening column comprises a first sub-column and a second sub-column, the first sub-column and the second sub-column are adjacent to each other;
the first sub-column and the second sub-column each comprises first sub-pixel openings and second sub-pixel openings, the first sub-pixel openings and the second sub-pixel openings are alternately arranged in a second direction;
the first sub-pixel openings in the first sub-column and the first sub-pixel openings in the second sub-column are adjacent to each other in a one-to-one correspondence manner; the second direction and the first direction cross with each other; and
the second sub-pixel opening column comprises two columns of third sub-pixel openings arranged in the first direction.

5. The array substrate according to claim 4, wherein the first sub-pixel opening is in a shape of a triangle, and two adjacent first sub-pixel openings in the first direction in the first sub-pixel opening column substantially form a rhombus; and
the second sub-pixel opening is in a shape of a triangle, the first sub-pixel opening and the second sub-pixel opening that are adjacent to each other in the second direction in the first sub-column substantially form a parallelogram; and
the first sub-pixel opening and the second sub-pixel opening that are adjacent to each other in the second direction in the second sub-column substantially form a parallelogram.

6. The array substrate according to claim 5, wherein the first sub-column and the second sub-column in the first sub-pixel opening column are arranged symmetrical with respect to each other.

7. The array substrate according to claim 5, wherein the third sub-pixel opening is in a shape of a quadrangle or a rectangle;
the third sub-pixel opening and the second sub-pixel opening are adjacent to each other; and
side edges, that are adjacent to each other, of the third sub-pixel opening and the second sub-pixel opening are substantially aligned with each other.

8. The array substrate according to claim 4, wherein a distance between the first sub-pixel opening column and the second sub-pixel opening column is greater than a distance between the first sub-pixel opening and the second sub-pixel opening.

9. The array substrate according to claim 4, wherein the first sub-pixel openings comprise red sub-pixel openings, the second sub-pixel openings comprise green sub-pixel openings, and the third sub-pixel openings comprise blue sub-pixel openings.

10. The array substrate according to claim 1, wherein the pixel defining layer between adjacent sub-pixel openings with different illumination colors is made of a material that is switched between a lyophilic property and a lyophobic property as a temperature of the substrate changes.

11. The array substrate according to claim 10, wherein the material, that is switched between the lyophilic property and the lyophobic property, of the pixel defining layer comprises poly(N-isopropylacrylamide).

12. The array substrate according to claim 4, wherein an area of the third sub-pixel opening is equal to a total area of the first sub-pixel opening and the second sub-pixel opening.

13. The array substrate according to claim 4, further comprising: a plurality of anodes arranged between the substrate and the pixel defining layer; and a hole injection layer, a hole transport layer, a light emitting layer and a cathode are sequentially stacked on a side of the pixel defining layer facing away from the substrate; wherein:
orthographic projections of the first sub-pixel opening, the second sub-pixel opening and the third sub-pixel opening on the substrate at least cover part of orthographic projections of the anodes on the substrate;
a shape of the anode corresponding to the first sub-pixel opening is same as a shape of the first sub-pixel opening;
a shape of the anode corresponding to the second sub-pixel opening is same as a shape of the second sub-pixel opening; and
a shape of the anode corresponding to the third sub-pixel opening is same as a shape of the third sub-pixel opening.

14. A display device, comprising a display panel, wherein the display panel comprises the array substrate of claim 1.

15. A manufacturing method for an array substrate, comprising:
forming a plurality of anodes on a substrate;
forming, on the substrate on which the anodes are formed, a pixel defining layer comprising a plurality of first sub-pixel opening columns and a plurality of second sub-pixel opening columns; wherein the plurality of first sub-pixel opening columns and the plurality of second sub-pixel opening columns are alternately arranged in a first direction; the first sub-pixel opening column comprises at least two types of sub-pixel openings with different illumination colors; the second sub-pixel opening column comprises sub-pixel openings with a same illumination color; the illumination color of the sub-pixel opening in the second sub-pixel opening column is different from the illumination colors of the sub-pixel opening in the first sub-pixel opening column; an area of the sub-pixel opening in the second sub-pixel opening column is greater than an area of the sub-pixel opening in the first sub-pixel column; the pixel defining layer between the first sub-pixel opening column and the second sub-pixel opening column is made of a lyophobic material; the pixel defining layer between adjacent sub-pixel openings in the second sub-pixel opening column is made of a lyophilic material; and in the first sub-pixel opening column, the pixel defining layer between adjacent sub-pixel openings with the same illumination color is made of a lyophilic material, and the pixel defining layer between adjacent sub-pixel openings with different illumination colors is made of a material that is switched between a lyophilic property and a lyophobic property as an external condition changes;
processing the substrate on which the pixel defining layer are formed under a first external condition, such that the material of the pixel defining layer between the adjacent sub-pixel openings with different illumination colors in the first sub-pixel opening column has a lyophilic property;
sequentially forming a hole injection layer and a hole transport layer that are stacked in red sub-pixel openings, green sub-pixel openings and blue sub-pixel openings through an ink-jet printing process;

processing the substrate on which the hole injection layer and the hole transport layer are formed under a second external condition, such that the material of the pixel defining layer between the adjacent sub-pixel openings with different illumination colors in the first sub-pixel opening column has a lyophobic property; wherein a temperature of the second external condition is different from that of the first external condition;

forming light emitting layer on a side of the hole transport layer facing away from the substrate through the ink-jet printing process; and forming a cathode on a side of the light emitting layer facing away from the substrate.

16. The display device according to claim 14, wherein the pixel defining layer made of the lyophobic material has a first thickness;

the pixel defining layer made of the material that is switched between the lyophilic property and the lyophobic property has a second thickness; and the pixel defining layer made of the lyophilic material has a third thickness;

wherein the first thickness is greater than the second thickness, and the second thickness is greater than the third thickness.

17. The display device according to claim 16, wherein the first thickness ranges from 1 μm to 1.5 μm, the second thickness ranges from 0.6 μm to 1 μm, and the third thickness ranges from 0.3 μm to 0.8 μm.

18. The display device according to claim 14, wherein the first sub-pixel opening column comprises a first sub-column and a second sub-column, the first sub-column and the second sub-column are adjacent to each other;

the first sub-column and the second sub-column each comprises first sub-pixel openings and second sub-pixel openings, the first sub-pixel openings and the second sub-pixel openings are alternately arranged in a second direction;

the first sub-pixel openings in the first sub-column and the first sub-pixel openings in the second sub-column are adjacent to each other in a one-to-one correspondence manner; the second direction and the first direction cross with each other; and the second sub-pixel opening column comprises two columns of third sub-pixel openings arranged in the first direction.

19. The display device according to claim 18, wherein the first sub-pixel opening is in a shape of a triangle, and two adjacent first sub-pixel openings in the first direction in the first sub-pixel opening column substantially form a rhombus; and the second sub-pixel opening is in a shape of a triangle, the first sub-pixel opening and the second sub-pixel opening that are adjacent to each other in the second direction in the first sub-column substantially form a parallelogram; and the first sub-pixel opening and the second sub-pixel opening that are adjacent to each other in the second direction in the second sub-column substantially form a parallelogram.

20. The display device according to claim 19, wherein the first sub-column and the second sub-column in the first sub-pixel opening column are arranged symmetrical with respect to each other.

* * * * *